United States Patent
Desai (10) Patent No.: US 11,853,214 B2
(45) Date of Patent: *Dec. 26, 2023

(54) COMPRESSED CACHE USING DYNAMICALLY STACKED ROARING BITMAPS

(71) Applicant: eBay Inc., San Jose, CA (US)

(72) Inventor: Amit Desai, Fremont, CA (US)

(73) Assignee: eBay Inc., San Jose, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 18/071,291

(22) Filed: Nov. 29, 2022

(65) Prior Publication Data
US 2023/0096331 A1     Mar. 30, 2023

Related U.S. Application Data (63) Continuation of application No. 17/239,660, filed on Apr. 25, 2021, now Pat. No. 11,544,190, which is a continuation of application No. 16/227,450, filed on Dec. 20, 2018, now Pat. No. 11,016,888.

(51) Int. Cl.
*G06F 12/0802* (2016.01)
*H03M 7/30* (2006.01)

(52) U.S. Cl.
CPC ......... *G06F 12/0802* (2013.01); *H03M 7/70* (2013.01); *G06F 2212/1044* (2013.01); *G06F 2212/608* (2013.01)

(58) Field of Classification Search
CPC ......... G06F 12/0802; G06F 2212/1044; G06F 2212/608; H03M 7/70
See application file for complete search history.

(56) References Cited

U.S. PATENT DOCUMENTS

| 8,121,987 | B2 | 2/2012 | Cha et al. | |
| 11,016,888 | B2* | 5/2021 | Desai | H03M 7/70 |
| 11,544,190 | B2* | 1/2023 | Desai | H04L 67/568 |
| 2003/0087219 | A1 | 5/2003 | Berger et al. | |
| 2005/0160234 | A1 | 7/2005 | Newburn et al. | |
| 2008/0120315 | A1 | 5/2008 | Ionescu et al. | |
| 2019/0324916 | A1 | 10/2019 | Armangau et al. | |
| 2019/0384765 | A1 | 12/2019 | White et al. | |
| 2020/0201760 | A1 | 6/2020 | Desai | |
| 2021/0248074 | A1 | 8/2021 | Desai | |
| 2022/0238193 | A1* | 7/2022 | Koc | G16H 15/00 |

OTHER PUBLICATIONS

"A High Performance Caching Library for Java 8", Retrieved from Internet URL: https://github.com/ben-manes/caffeine, Jan. 30, 2020, 3 Pages.

"Ehcache—Java's Most Widely-Used Cache", Retrieved from Internet URL: http://www.ehcache.org/, Accessed on Jan. 30, 2020, 4 Pages.

(Continued)

*Primary Examiner* — Zhuo H Li
(74) *Attorney, Agent, or Firm* — FIG. 1 Patents (57) ABSTRACT

A method for compressing data in a local cache of a web server is described. A local cache compression engine accesses values in the local cache and determines a cardinality of the values of the local cache. The local cache compression engine determines a compression rate of a compression algorithm based on the cardinality of the values of the local cache. The compression algorithm is applied to the cache based on the compression rate to generate a compressed local cache.

20 Claims, 7 Drawing Sheets

(56) References Cited

OTHER PUBLICATIONS

U.S. Appl. No. 16/227,450, "Applicant Interview summary received for U.S. Appl. No. 16/227,450 dated Aug. 7, 2020", filed Aug. 7, 2020, 3 Pages.
U.S. Appl. No. 16/227,450, "Applicant Initiated Interview Summary Received for U.S. Appl. No. 16/227,450, dated Nov. 24, 2020", filed Nov. 24, 2020, 3 Pages.
U.S. Appl. No. 16/227,450, "Final Office Action Received for U.S. Appl. No. 16/227,450, dated Oct. 15, 2020", filed Oct. 15, 2020, 12 Pages.
U.S. Appl. No. 16/227,450, "Non Final Office Action Received for U.S. Appl. No. 16/227,450, dated May 14, 2020", filed May 14, 2020, 10 Pages.
U.S. Appl. No. 16/227,450, "Notice of Allowance Received for U.S. Appl. No. 16/227,450, dated Jan. 28, 2021", filed Jan. 28, 2021, 9 Pages.
U.S. Appl. No. 17/239,660, "Corrected Notice of Allowability", U.S. Appl. No. 17/239,660, dated Sep. 14, 2022, 2 pages.
U.S. Appl. No. 17/239,660, "Non-Final Office Action", U.S. Appl. No. 17/239,660, dated May 27, 2022, 7 pages.
U.S. Appl. No. 17/239,660, "Notice of Allowance", U.S. Appl. No. 17/239,660, dated Aug. 31, 2022, 8 pages.
Sardashti, et al., "Yet Another Compressed Cache: a Low Cost Yet Effective Compressed Cache", Research Report, Retrieved from Internet URL: https://hal.inria.fr/hal-01270792/document, Feb. 2016, 24 Pages.
Scalegrid, "Introduction to Redis Data Structures: Bitmaps", Retrieved from the Internet URL: <https://scalegrid.io/blog/introduction-to-redis-data-structure-bitmaps/>, Apr. 16, 2016, 7 Pages.

\* cited by examiner

FIG. 7

COMPRESSED CACHE USING DYNAMICALLY STACKED ROARING BITMAPS

RELATED APPLICATIONS

This application is a continuation of and claims priority to U.S. patent application Ser. No. 17/239,660 filed Apr. 25, 2021, which is a continuation of application Ser. No. 16/227,450, filed Dec. 20, 2018, the entire disclosures of which is hereby incorporated by reference herein in its entirety.

TECHNICAL FIELD

The subject matter disclosed herein generally relates to a special-purpose machine that includes a dynamically compressed local cache, including computerized variants of such machines and improvements to such variants, and to the technologies by which such machines become improved compared to other machines that include uncompressed local cache. Specifically, the present disclosure addresses systems and methods that dynamically adjust the elasticity of a compression of the local cache based on cardinal values in the local cache.

BACKGROUND

Cache refers to a part of a memory that stores data so that subsequent requests for that data can be retrieved faster. Cache allows for low latency at web, application, and database tiers. However, the size of these cache can be extremely large due to the increasing amount of data being requested and exchanged by the application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

"Component" refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor or other programmable processor. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component"(or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some example embodiments, the processors or processor-implemented components may be located in a single geographic location (e.g., within a home environment, an office environment, or a server farm). In other example embodiments, the processors or processor-implemented components may be distributed across a number of geographic locations.

"Communication Network" refers to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology.

"Machine-Storage Medium" refers to a single or multiple storage devices and/or media (e.g., a centralized or distributed database, and/or associated caches and servers) that store executable instructions, routines and/or data. The term shall accordingly be taken to include, but not be limited to, solid-state memories, and optical and magnetic media, including memory internal or external to processors. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Processor" refers to any circuit or virtual circuit (a physical circuit emulated by logic executing on an actual processor) that manipulates data values according to control signals (e.g., "commands", "op codes", "machine code", etc.) and which produces corresponding output signals that are applied to operate a machine. A processor may, for example, be a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC) or any combination thereof. A processor may further be a multi-core processor having two or more independent processors (sometimes referred to as "cores") that may execute instructions contemporaneously.

"Carrier Signal" refers to any intangible medium that is capable of storing, encoding, or carrying instructions for execution by the machine, and includes digital or analog communications signals or other intangible media to facilitate communication of such instructions. Instructions may be transmitted or received over a network using a transmission medium via a network interface device.

"Signal Medium" refers to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"Computer-Readable Medium" refers to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

Cache refers to a part of a memory that stores data so that subsequent requests for that data can be retrieved faster. Cache allows for low latency at web, application, and database tiers. However, the size of these cache can be extremely large due to the increasing amount of data being requested and exchanged. Due to their large size, these caches are hosted on a remote cache cluster separate from the web server. Therefore, a web server accesses the cache from the remote cache cluster. However, in the event of network partition, the web server has no access to the remote cache. The web server thus accesses the local database to retrieve the data. In other situations, the web server returns an error or default values when the web server fails to access the remote cache.

The present application describes a method for keeping a cache locally at the web server in highly compressed form. Applications using this local cache are unaware of the compression or the underlying storage implementations, and rather relies on standard CRUD (create, read, update, and delete) operations. The local compressed cache is periodically synchronized with the remote (uncompressed) cache. Therefore, in case of network partition, the web server still has access to data locally by accessing the local compressed cache when the remote cache cannot be reached.

In one example embodiment, a local cache compression engine accesses values in the local cache and determines a cardinality of the values of the local cache. The local cache compression engine determines a compression rate of a compression algorithm based on the cardinality of the values of the local cache. The compression algorithm is applied to the cache based on the compression rate to generate a compressed local cache.

As a result, one or more of the methodologies described herein facilitate solving the technical problem of compressing data in a local cache and yet having a compressed local cache that support bitmaps or bitmap operations since local memory caches do not support bitmap operations. By having a local cache with bitmaps, one or more of the methodologies described herein may obviate a need for certain efforts or computing resources that otherwise would be involved. As a result, resources used by one or more machines, databases, or devices (e.g., within the environment) may be reduced. Examples of such computing resources include processor cycles, network traffic, memory usage, data storage capacity, power consumption, network bandwidth, and cooling capacity.

Figure 1:
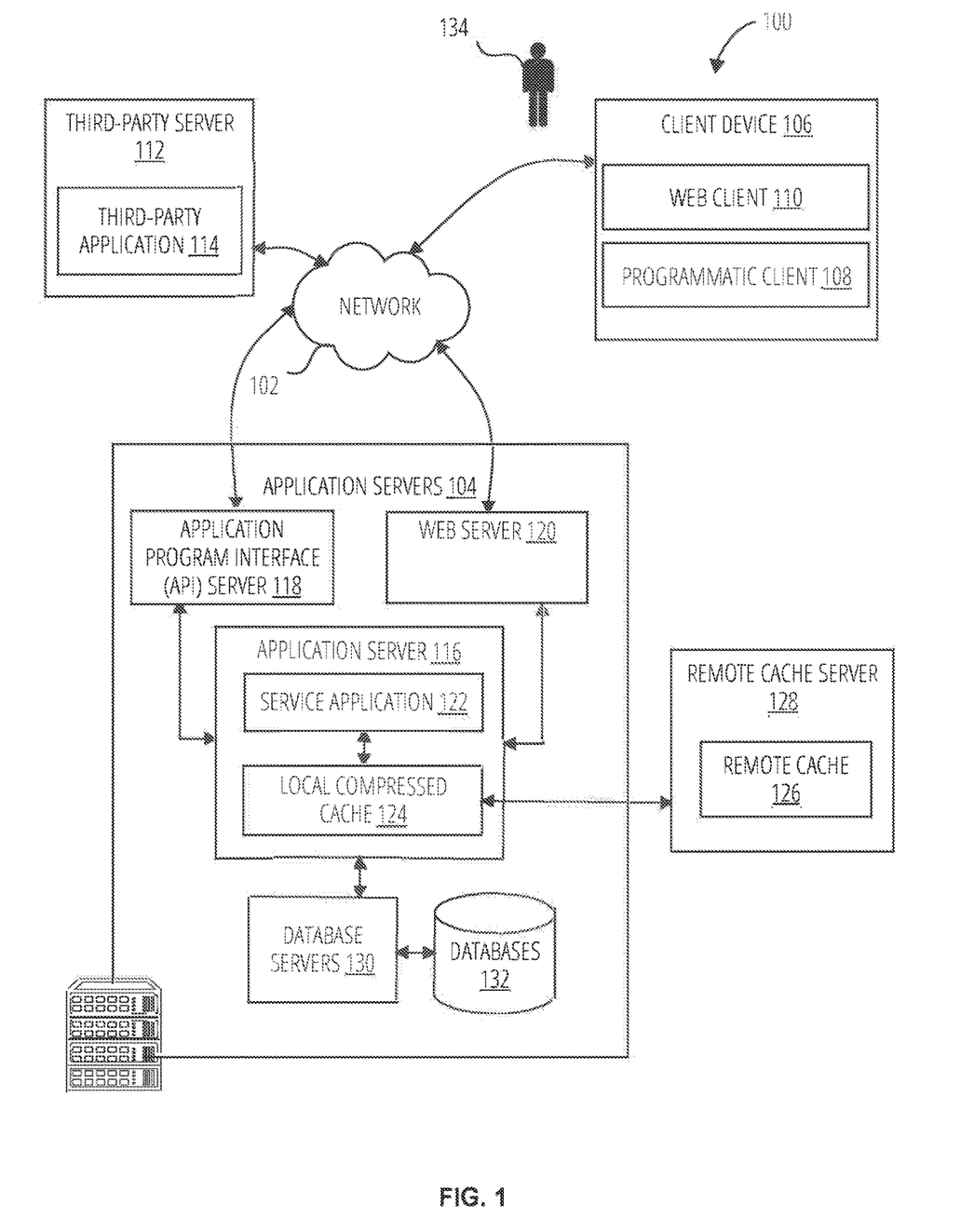
FIG. 1 is a diagrammatic representation of a networked environment in which the present disclosure may be deployed, in accordance with some example embodiments.

FIG. 1 is a diagrammatic representation of a network environment 100 in which some example embodiments of the present disclosure may be implemented or deployed.

One or more application servers 104 provide server-side functionality via a network 102 to a networked user device, in the form of a client device 110. A web client 110 (e.g., a browser) and a programmatic client 108 (e.g., an "app") are hosted and execute on the web client 110.

An Application Program Interface (API) server 118 and a web server 120 provide respective programmatic and web interfaces to application servers 104. A specific application server 116 hosts a service application 122, which includes components, modules and/or applications, and a local compressed cache 124.

The service application 122 may provide a number of functions and services to users who access the application servers 104. The service application 112 may include a publication application that enables users to publish content (e.g., product item information) on a hosted web page. While the service application 122 is shown in FIG. 1 to be part of the application servers 104, it will be appreciated that, in alternative embodiments, the service application 122 may be separate and distinct from the application server 116.

The local compressed cache 124 includes a dynamic and elastic cache in which the compression increases or shrinks based on a cardinality of data values (or number of sets of unique elements in the data values) stored in the local compressed cache 124. For example, the size of the local compressed cache 124 increases as the cardinality of the data values decreases. Conversely, the size of the local compressed cache 124 decreases as the cardinality of the data values increases.

The local compressed cache 124 communicates or synchronizes with a remote cache 126 of a remote cache server 128. In one example, the local compressed cache 124 communicates, to the remote cache 126, bitmaps (that represents the data values stored in the local compressed cache 124) instead of the actual data values. The communicated bitmaps provide a representation of the data values and reduce the amount of data being transmitted to and from the remote cache 126. This reduction in amount of communicated data results in a reduction of required bandwidth between the local compressed cache 124 and the remote cache 124.

Further, while the network environment 100 shown in FIG. 1 employs a client-server architecture, the embodiments are, of course, not limited to such an architecture, and could equally well find application in a distributed, or peer-to-peer, architecture system, for example. The service application 122 could also be implemented as a standalone software program, which do not necessarily have networking capabilities.

The web client 110 accesses the service application 122 via the web interface supported by the web server 120. Similarly, the programmatic client 108 accesses the various services and functions provided by the service application 122 via the programmatic interface provided by the Application Program Interface (API) server 118. In one example, a programmatic client 108 may, for example, be a seller application (e.g., eBay Application developed by eBay Inc., of San Jose, California) to enable sellers to author and manage listings on the network environment 100 in an offline manner, and to perform batch-mode communications between the programmatic client 108 and the application servers 104. Other seller applications or APIs may be hosted by AMAZON, ETSY, GOOGLE, WALMART or any other e-commerce company. Notably, API server 118 may offer a seller application directly accessible as a web site and need not be accessed by a separate client application (or the programmatic client 108 is hosted in a client browser).

FIG. 1 also illustrates a third-party application 114 executing on a third-party server 112 as having programmatic access to the application servers 104 via the programmatic interface provided by the Application Program Interface (API) server 118. For example, the third-party application 114 may, utilizing information retrieved from the application server 116, support one or more features or functions on a website hosted by a third party. The third-party website may, for example, provide one or more promotional, marketplace, or payment functions that are supported by the relevant applications of the application servers 104.

Any of the systems or machines (e.g., databases, devices, servers) shown in, or associated with, FIG. 1 may be, include, or otherwise be implemented in a special-purpose (e.g., specialized or otherwise non-generic) computer that has been modified (e.g., configured or programmed by software, such as one or more software modules of an application, operating system, firmware, middleware, or other program) to perform one or more of the functions described herein for that system or machine. For example, a special-purpose computer system able to implement any one or more of the methodologies described herein is discussed below with respect to FIG. 4, and such a special-purpose computer may accordingly be a means for performing any one or more of the methodologies discussed herein. Within the technical field of such special-purpose computers, a special-purpose computer that has been modified by the structures discussed herein to perform the functions discussed herein is technically improved compared to other special-purpose computers that lack the structures discussed herein or are otherwise unable to perform the functions discussed herein. Accordingly, a special-purpose machine configured according to the systems and methods discussed herein provides an improvement to the technology of similar special-purpose machines.

Moreover, any two or more of the systems or machines illustrated in FIG. 1 may be combined into a single system or machine, and the functions described herein for any single system or machine may be subdivided among multiple systems or machines. Additionally, any number and types of client device 106 may be embodied within the network environment 100. Furthermore, some components or functions of the network environment 100 may be combined or located elsewhere in the network environment 100. For example, some of the functions of the client device 106 may be embodied at the application server 116.

Figure 2:
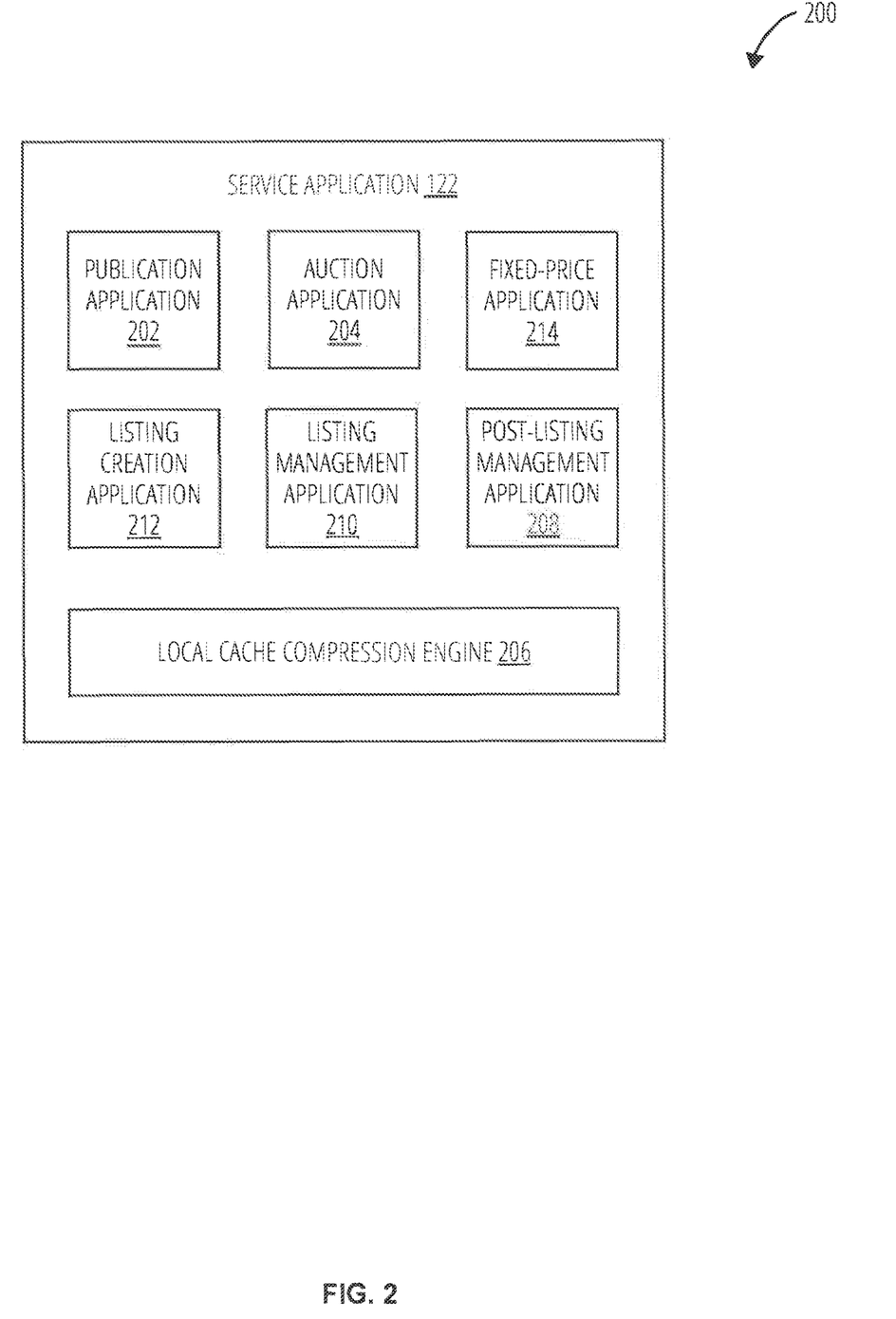
FIG. 2 is a block diagram illustrating a service application that, in one example embodiment, is provided as part of a networked system.

FIG. 2 is a block diagram illustrating the service application 122 that, in one example embodiment, are provided as part of the network environment 100. The service application 122 may be hosted on dedicated or shared server machines (not shown) that are communicatively coupled to enable communications between or among server machines. The service application 122 themselves are communicatively coupled (e.g., via appropriate interfaces) to each other and to various data sources, to allow information to be passed between or among the service application 122 or so as to allow the service application 122 to share and access common data. The service application 122 may furthermore access one or more databases 132 via the database servers 130.

In one embodiment, the application server 116 may provide a number of publishing, listing, and price-setting mechanisms whereby a seller may list (or publish information concerning) goods or services for sale, a buyer can express interest in or indicate a desire to purchase such goods or services, and a price can be set for a transaction pertaining to the goods or services. To this end, the service application 122 is shown to include at least one publication application 202 and one or more auction application 204, which support auction-format listing and price setting mechanisms (e.g., English, Dutch, Vickrey, Chinese, Double, Reverse auctions, etc.). The various auction application 204 may also provide a number of features in support of such auction-format listings, such as a reserve price feature whereby a seller may specify a reserve price in connection with a listing and a proxy-bidding feature whereby a bidder may invoke automated proxy bidding.

A number of fixed-price application 214 support fixed-price listing formats (e.g., the traditional classified advertisement-type listing or a catalogue listing) and buyout-type listings. Specifically, buyout-type listings (e.g., including the Buy-It-Now (BIN) technology developed by eBay Inc., of San Jose, California) may be offered in conjunction with auction-format listings and allow a buyer to purchase goods or services, which are also being offered for sale via an auction, for a fixed price that is typically higher than the starting price of the auction.

Listing creation application 212 allow sellers to conveniently author listings pertaining to goods or services that they wish to transact via the application servers 104, and listing management application 210 allow sellers to manage such listings. Specifically, where a particular seller has authored and/or published a large number of listings, the management of such listings may present a challenge. The listing management application 210 provides a number of features (e.g., auto-relisting, inventory level monitors, etc.) to assist the seller in managing such listings. The post-listing management application 208 also assists sellers with a number of activities that typically occur post-listing.

Notably, Application Server 116 may host any type of Service Application 122, and is not restricted to e-commerce technologies. It is possible for the cache techniques described herein to improve performance, memory usage, and computational resource usage of a number of web services, such as web site search services, database servers, etc. Any application that involves repetitive data that can be cached, and that would benefit from a dynamic and elastic size of cache based on analysis of cardinality of data values coupled with dynamic allocation of data structures such as roaring bitmaps.

A local cache compression engine 206 accesses data values from a cache and applies a compression algorithm (e.g., roaring bitmap) to the data values based on a compression rate derived from a cardinality of the data values. Therefore, the local cache compression engine 206 generates an elastic or dynamically compression-adjusted local cache. The local cache compression engine 206 is discussed in more detail below with respect to FIG. 3.

It should be noted that the term "web browser" as used in this disclosure shall be interpreted broadly to cover any application capable of displaying item attributes and rendering images from a web server. As such, this may include traditional web browsers as well as stand-alone applications (or apps) operating on mobile or other devices. For example, the web browser could be a traditional web browser, a stand-alone app such as a shopping application, a mobile app, a video player app, etc.

Figure 3:
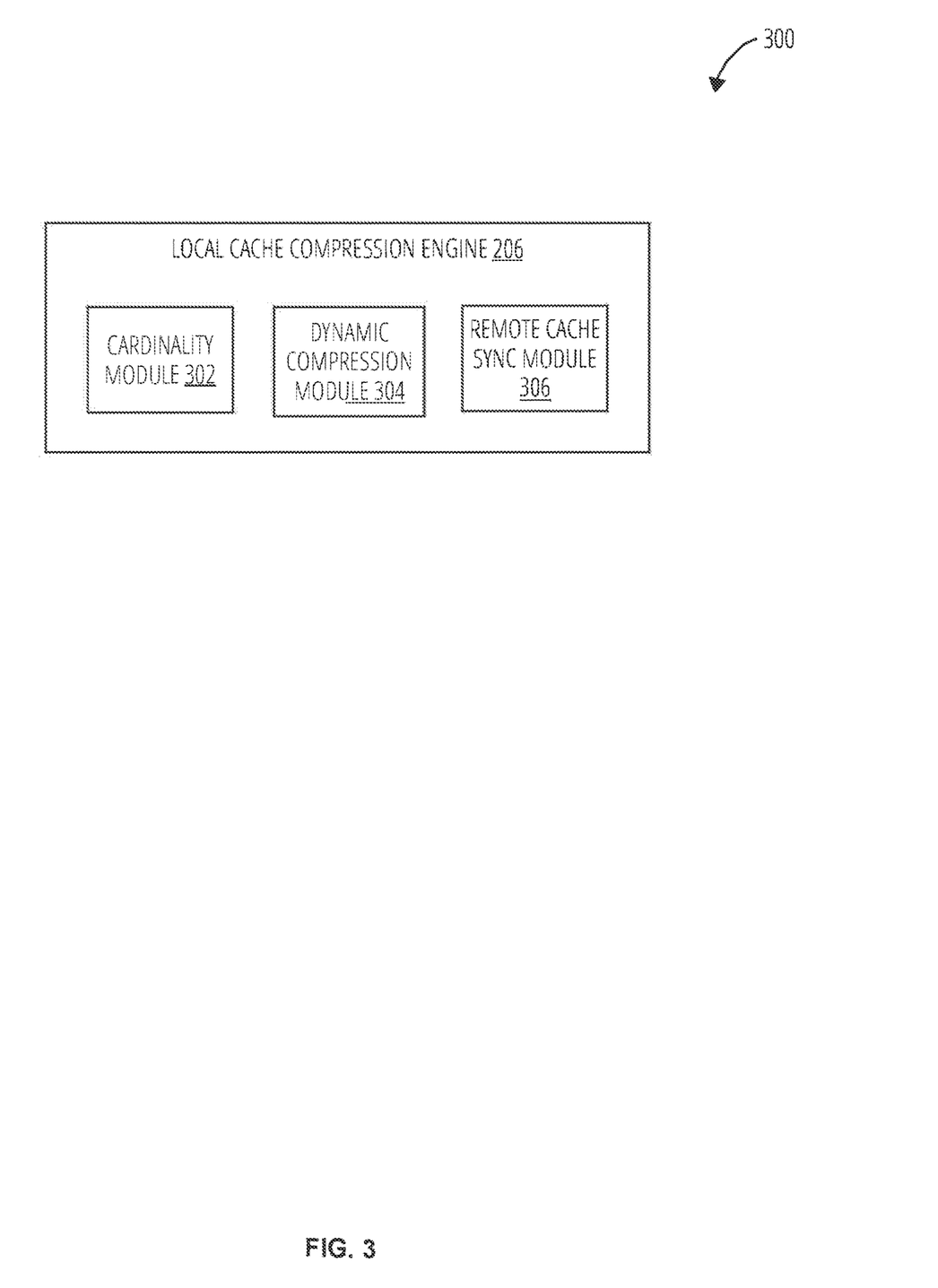
FIG. 3 is a block diagram illustrating a local cache compression engine, in accordance with one example embodiment.
Figure 5:
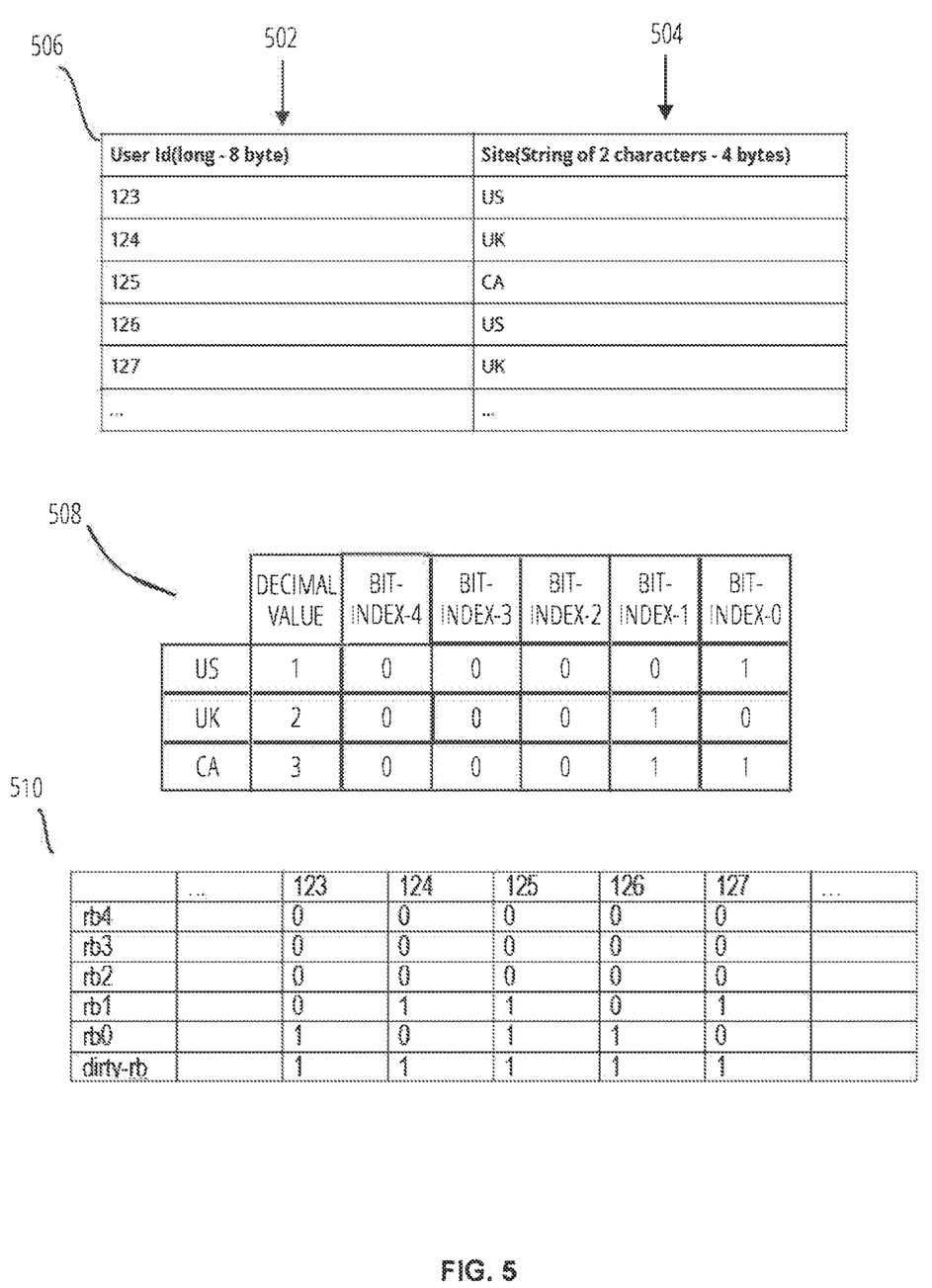
FIG. 5 illustrates an example of a cache compression in accordance with one embodiment.

FIG. 3 is a block diagram illustrating a local cache compression engine 206, in accordance with one example embodiment. The local cache compression engine 206 comprises a cardinality module 302, a dynamic compression module 304, and a remote cache sync module 306. The cardinality module 302 determines a cardinality of the data values in the cache. In one embodiment, cardinality refers to the uniqueness of data values, or entropy of data values, contained in a particular attribute of a data table. In another embodiment, cardinality may refer to the number of data values to be compressed. The higher the cardinality, the more duplicated elements in a column. FIG. 5, further described below, provides an example of cardinality of data values in a table. The dynamic compression module 304 determines the compression ratio based on the cardinality of the data values in the cache, and then dynamic compression module 304 may set attributes for compression, such as the number of roaring bitmaps to allocate, based on the results. Dynamic compression module 304 may take other actions based on the results of the cardinality analysis, such as use of a different compression algorithm. For example, the compression ratio is proportional to the cardinality of the data values. FIG. 5, further described below, provides an example of how compressed data are stored in the cache.

The remote cache sync module 306 periodically synchronizes the data values in the local compressed cache 124 with the data values in the remote cache 126. The remote cache 126 may periodically synchronize its data values with other local compressed cache of other devices (not shown). As such, the remote cache 126 acts as an always up to date master repository that is synchronized with other local compressed cache of other devices.

In another example embodiment, the local compressed cache 124 may be implemented in any other computing device other than the application server 116. For example, a mobile device (e.g., smartphone) may include its own local compressed cache.

Figure 4:
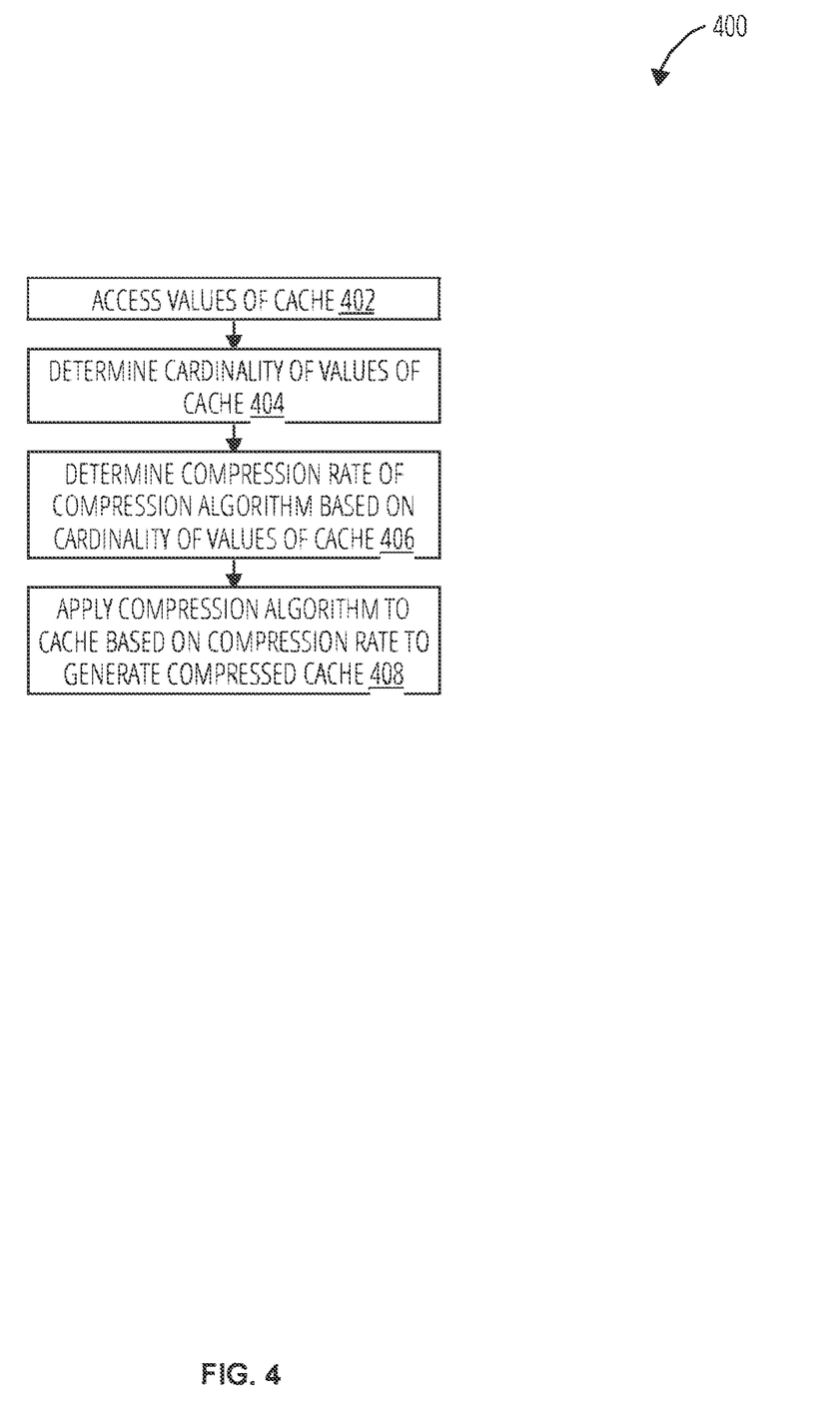
FIG. 4 illustrates a method for compressing data values in a local cache in accordance with one embodiment.

FIG. 4 is a flow diagram illustrating a method 400 for compressing data in a local cache of a web server, in accordance with an example embodiment. Operations in the method 400 may be performed by the local cache compression engine 206, using components (e.g., modules, engines) described above with respect to FIG. 3. Accordingly, the method 400 is described by way of example with reference to the local cache compression engine 206. However, it shall be appreciated that at least some of the operations of the method 400 may be deployed on various other hardware configurations or be performed by similar components residing elsewhere. For example, some of the operations may be performed at the web server 120. In block 402, the cardinality module 302 accesses values of a cache. In block 404, the cardinality module 302 determines a cardinality of the values of the cache. In block 406, the dynamic compression module 304 determines a compression rate of a compression algorithm based on the cardinality of the values of the cache. In block 408, the dynamic compression module 304 applies the compression algorithm to the cache based on the compression rate to generate a compressed cache.

FIG. 5 illustrates an example of compressing data values in a local cache. Table 506 illustrates an example of data values to be stored in the local compressed cache 124. The table 506 includes a set of user ID 502 (e.g., 8-byte data) and corresponding site ID 504 (e.g., 4 bytes data). As an example, there are 100 million unique user IDs and that the site ID has 30 different possible values. If the data from table 506 were to be stored in an uncompressed format in a cache, the size of the cache would be about 1.2 GB (100 million×8 bytes+100 million×4 bytes=1.2 GB).

In contrast, the present application describes an example of a method for compressing data values from the table 506 using roaring bitmaps. The cardinality module 302 determines that the cardinality of site ID values at the time of initialization of the local cache is 30 (e.g., from the different unique site IDs). The dynamic compression module 304 initializes the number of roaring bitmaps (e.g., in this case rb=5 roaring bitmaps (floor(log(30)+1)). Therefore, a maximum of 5 bits can represent 30 unique values. The entropy, or cardinality of the site ID field, affects the size of a data structure to be allocated for compression, and therefore the amount of memory used by the cache. In this way, a dynamic analysis of the data results in an elastic size of cache because the size of data structure, such as the number of columns in a roaring bitmap, can be larger, if cardinality is large, or smaller (if cardinality or entropy is smaller).

In one example embodiment, the dynamic compression module 304 initializes one additional "dirty" bitmap to mark which fields are updated and which fields require synchronization with the remote cache server 128.

Next, as the unique values are put into the cache, they are assigned a bit pattern of 5 bits. Table 508 illustrates an example of the 5-bit pattern. Table 510 illustrates the bit patterns being assigned in an increasing order. For example, rb0 stores bits of bit-index-0, and rb1 stores bits of bit-index-1. Also, rbX has higher or equal compression ratio compared to rbY where X is greater than Y because bit patterns are assigned in increasing natural order. Therefore, the number of bitmaps needed to store the data values is 5 bitmaps. In the example, the size of the local compressed cache 124 is now 12 MB (100 million bits*5 bitmaps).

Figure 6:
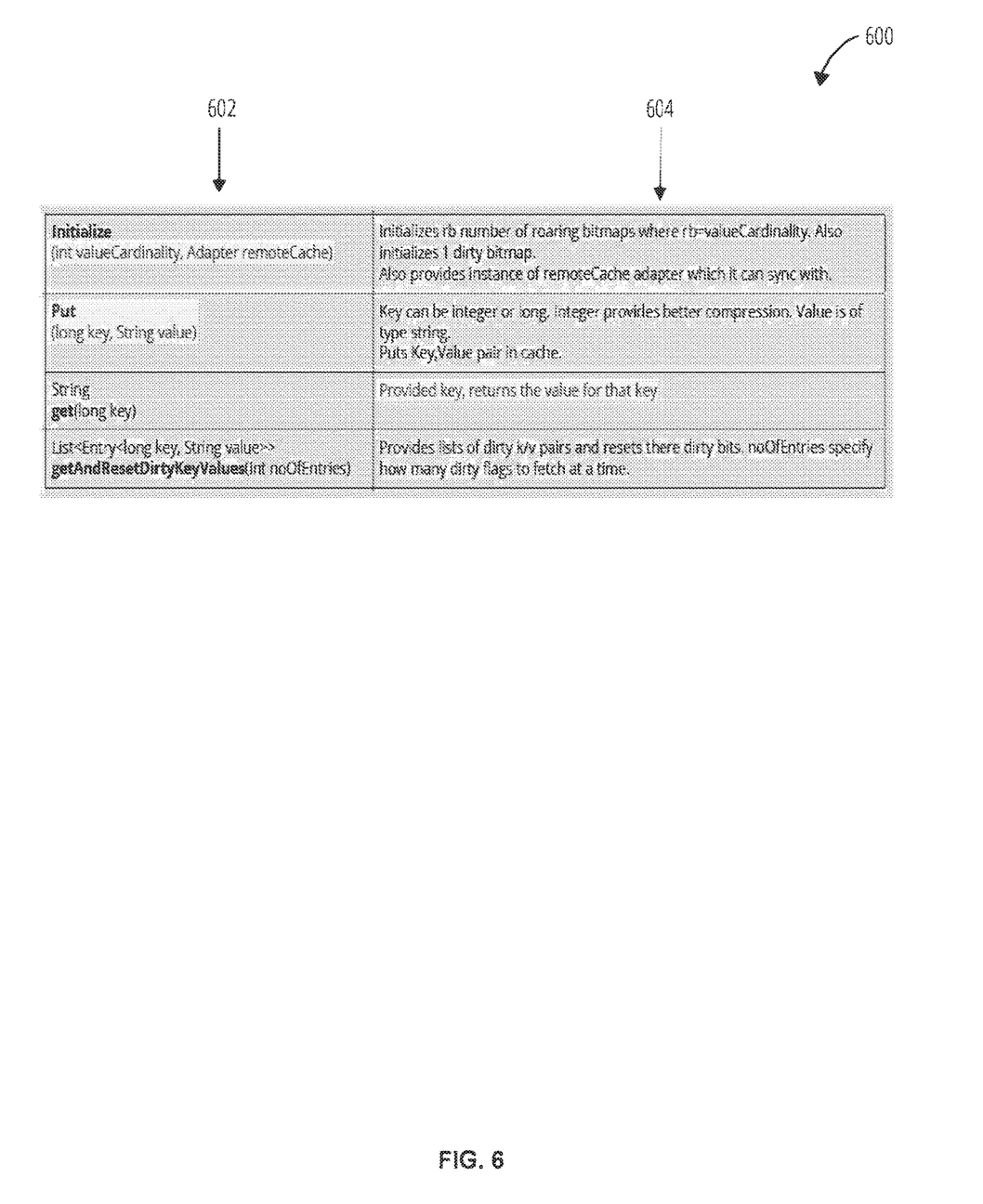
FIG. 6 illustrates an example of an API table accessing data value from a compressed cache in accordance with one embodiment.

FIG. 6 illustrates an example of an API table accessing data value from a compressed cache in accordance with one embodiment. The API table 600 illustrates standard API operations provided by local cache framework library of the local compressed cache 124. The API table 600 illustrates examples of operations 602 and their corresponding functions 604. The application server 116 is unaware of any compression of the local compressed cache 124.

Figure 7:
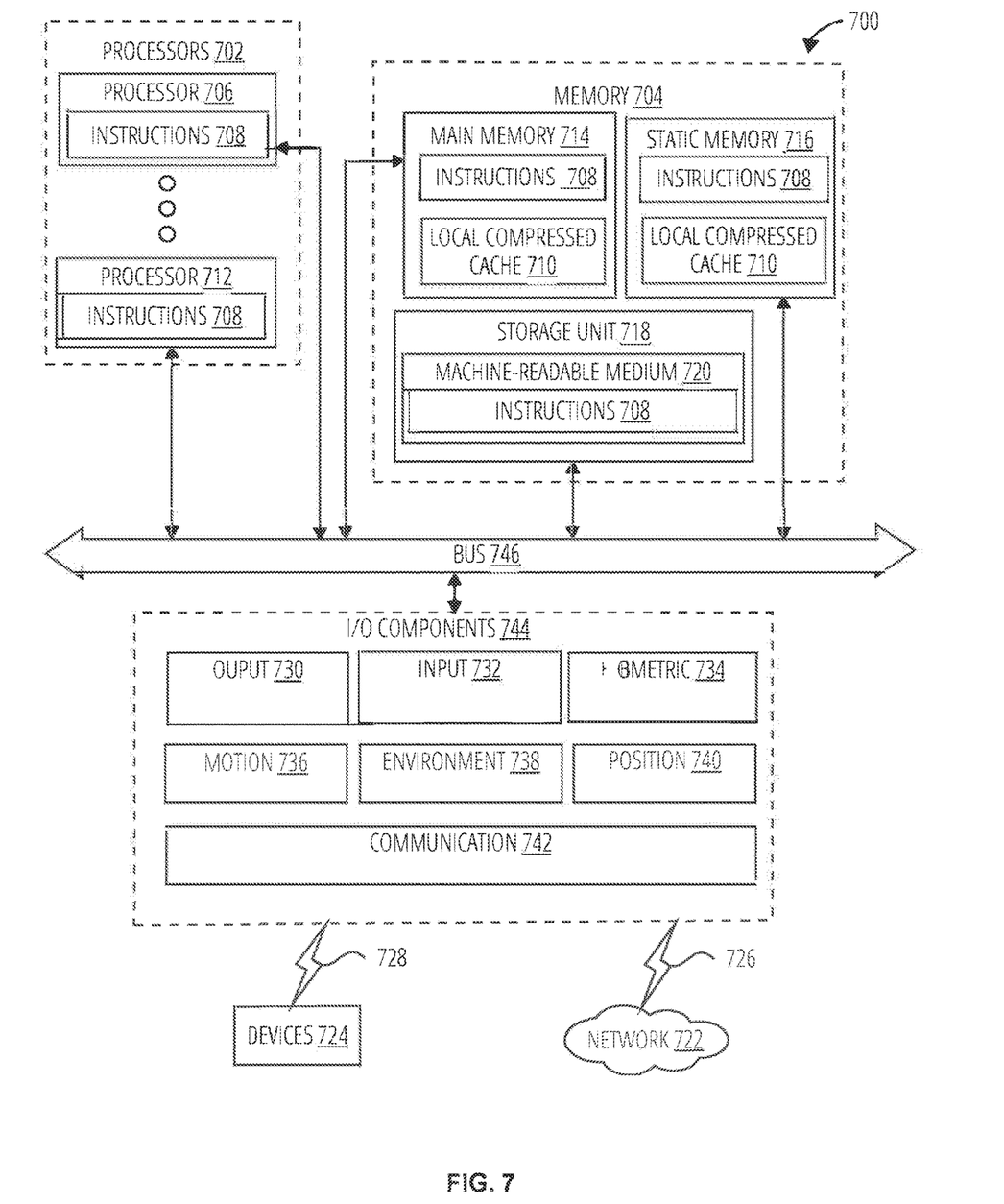
FIG. 7 is a diagrammatic representation of a machine in the form of a computer system within which a set of instructions may be executed for causing the machine to perform any one or more of the methodologies discussed herein, according to an example embodiment.

FIG. 7 is a diagrammatic representation of the machine 700 within which instructions 708 (e.g., software, a program, an application, an applet, an app, or other executable code) for causing the machine 700 to perform any one or more of the methodologies discussed herein may be executed. For example, the instructions 708 may cause the machine 700 to execute any one or more of the methods described herein. The instructions 708 transform the general, non-programmed machine 700 into a particular machine 700 programmed to carry out the described and illustrated functions in the manner described. The machine 700 may operate as a standalone device or may be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 708, sequentially or otherwise, that specify actions to be taken by the machine 700. Further, while only a single machine 700 is illustrated, the term "machine" shall also be taken to include a collection of machines that individually or jointly execute the instructions 708 to perform any one or more of the methodologies discussed herein.

The machine 700 may include processors 702, memory 704, and I/O components 742, which may be configured to communicate with each other via a bus 744. In an example embodiment, the processors 702 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 706 and a processor 710 that execute the instructions 708. The term "processor" is intended to include multi-core processors that may comprise two or more independent processors (sometimes referred to as "cores") that may execute instructions contemporaneously. Although FIG. 7 shows multiple processors 702, the machine 700 may include a single processor with a single core, a single processor with multiple cores (e.g., a multi-core processor), multiple processors with a single core, multiple processors with multiples cores, or any combination thereof.

The memory 704 includes a main memory 712, a static memory 714, and a storage unit 716, both accessible to the processors 702 via the bus 744. The main memory 704, the static memory 714, and storage unit 716 store the instructions 708 embodying any one or more of the methodologies or functions described herein. The instructions 708 may also reside, completely or partially, within the main memory 712, within the static memory 714, within machine-readable medium 718 within the storage unit 716, within at least one of the processors 702 (e.g., within the processor's cache memory), or any suitable combination thereof, during execution thereof by the machine 700. In one example embodiment, the main memory 714 and the static memory 716 store the local compressed cache 710.

The I/O components 742 may include a wide variety of components to receive input, provide output, produce output, transmit information, exchange information, capture measurements, and so on. The specific I/O components 742 that are included in a particular machine will depend on the type of machine. For example, portable machines such as mobile phones may include a touch input device or other such input mechanisms, while a headless server machine will likely not include such a touch input device. It will be appreciated that the I/O components 742 may include many other components that are not shown in FIG. 7. In various example embodiments, the I/O components 742 may include output components 728 and input components 730. The output components 728 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 730 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 742 may include biometric components 732, motion components 734, environmental components 736, or position components 738, among a wide array of other components. For example, the biometric components 732 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 734 include acceleration sensor components (e.g., accelerometer), gravitation sensor components, rotation sensor components (e.g., gyroscope), and so forth. The environmental components 736 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 738 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 742 further include communication components 740 operable to couple the machine 700 to a network 720 or devices 722 via a coupling 724 and a coupling 726, respectively. For example, the communication components 740 may include a network interface component or another suitable device to interface with the network 720. In further examples, the communication components 740 may include wired communication components, wireless communication components, cellular communication components, Near Field Communication (NFC) components, Bluetooth® components (e.g., Bluetooth®Low Energy), Wi-Fi® components, and other communication components to provide communication via other modalities. The devices 722 may be another machine or any of a wide variety of peripheral devices (e.g., a peripheral device coupled via a USB).

Moreover, the communication components 740 may detect identifiers or include components operable to detect identifiers. For example, the communication components 740 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 740, such as location via Internet Protocol (IP) geolocation, location via Wi-Fi® signal triangulation, location via detecting an NFC beacon signal that may indicate a particular location, and so forth.

The various memories (e.g., memory 704, main memory 712, static memory 714, and/or memory of the processors 702) and/or storage unit 716 may store one or more sets of instructions and data structures (e.g., software) embodying or used by any one or more of the methodologies or functions described herein. These instructions (e.g., the instructions 708), when executed by processors 702, cause various operations to implement the disclosed embodiments.

The instructions 708 may be transmitted or received over the network 720, using a transmission medium, via a network interface device (e.g., a network interface component included in the communication components 740) and using any one of a number of well-known transfer protocols (e.g., hypertext transfer protocol (HTTP)). Similarly, the instructions 708 may be transmitted or received using a transmission medium via the coupling 726 (e.g., a peer-to-peer coupling) to the devices 722.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

EXAMPLES

Example 1 is a computer-implemented method. The method comprises: accessing values of a cache; determining a cardinality of the values of the cache; determining a compression rate of a compression algorithm based on the cardinality of the values of the cache; and applying the compression algorithm to the cache based on the compression rate to generate a compressed cache.

In example 2, the subject matter of example 1 can optionally include: detecting a change in the cardinality of the values of the cache; adjusting the compression rate based on the change in the cardinality of the values of the cache; applying the compression algorithm to the cache based on the adjusted compression rate to generate an updated compressed cache; and updating the compressed cache with the updated compressed cache.

In example 3, the subject matter of example 1 can optionally include: wherein the compression algorithm includes a roaring bitmap.

In example 4, the subject matter of example 3 can optionally include: modifying a number of the roaring bitmaps in response to determining the cardinality of the values of the cache, wherein the roaring bitmap includes data values to be compressed.

In example 5, the subject matter of example 3 can optionally include: wherein the roaring bitmap includes data values to be compressed.

In example 6, the subject matter of example 5 can optionally include: wherein the data values include web site attributes.

In example 7, the subject matter of example 5 can optionally include: wherein the data values include web site attributes.

In example 8, the subject matter of example 7 can optionally include: wherein the compressed cache is transparent to an application of the web server, and wherein the application of the web server is configured to access a content of the compressed cache.

In example 9, the subject matter of example 1 can optionally include: synchronizing the content of the compressed cache with a remote cache, the remote cache being part of a network partition of a cache server cluster.

In example 10, the subject matter of example 9 can optionally include: wherein the remote cache is synchronized with a content of another compressed cache of another web server.

What is claimed is:

1. A computer-implemented method comprising:
   determining a cardinality of data values stored in a cache;
   determining, via an analysis of the cardinality of the data values stored in the cache, a compression ratio for compression of the data values stored in the cache, the compression including a roaring bitmap including one or more of the data values of the cache to be compressed via the compression; and
   applying, based on the analysis, the compression to the data values stored in the cache to generate a compressed cache, the compression including the compression ratio.

2. The computer-implemented method of claim 1, wherein the cardinality of the data values stored in the cache is an entropy of the data values stored in the cache.

3. The computer-implemented method of claim 1, further comprising:
   detecting a change in the cardinality of the data values stored in the cache;
   determining, via a second analysis of the cardinality of the data values stored in the cache, a different compression ratio for a different compression of the data values stored in the cache;
   applying, based on the second analysis, the different compression to the data values stored in the cache to generate an updated compressed cache, the different compression including the different compression ratio; and
   updating the compressed cache with the updated compressed cache.

4. The computer-implemented method of claim 1, wherein applying the compression includes modifying a number of roaring bitmaps in response to determining the cardinality of the data values stored in the cache.

5. The computer-implemented method of claim 1, wherein the data values include web site attributes.

6. The computer-implemented method of claim 1, further comprising accessing the data values stored in the cache.

7. The computer-implemented method of claim 1, wherein the compressed cache is transparent to an application, and wherein the application is configured to access content of the compressed cache.

8. The computer-implemented method of claim 1, further comprising synchronizing content of the compressed cache with a remote cache, the remote cache being part of a network partition of a cache server cluster.

9. The computer-implemented method of claim 8, wherein the remote cache is synchronized with content of an additional compressed cache.

10. A computing device, the computing device comprising:
    a processor; and
    a memory storing instructions that, when executed by the processor, configure the computing device to:
       determine a cardinality of data values stored in a cache;
       determine, via an analysis of the cardinality of the data values stored in the cache, a compression ratio for compression of the data values stored in the cache, the compression including a roaring bitmap including one or more of the data values of the cache to be compressed via the compression; and
       apply, based on the analysis, the compression to the data values stored in the cache to generate a compressed cache, the compression including the compression ratio.

11. The computing device of claim 10, wherein the cardinality of the data values stored in the cache is an entropy of the data values stored in the cache.

12. The computing device of claim 10, wherein the instructions further configure the computing device to:
    detect a change in the cardinality of the data values stored in the cache;
    determining, via a second analysis of the data values stored in the cache, an updated compression ratio for a different compression of the data values stored in the cache;
    applying, based on the second analysis, the different compression to the data values stored in the cache to generate an updated compressed cache, the different compression including the updated compression ratio; and
    update the compressed cache with the updated compressed cache.

13. The computing device of claim 10, wherein the instructions to configure the computing device to apply the compression includes instructions to configure the computing device to modify a number of roaring bitmaps in response to determining the cardinality of the data values of the cache.

14. The computing device of claim 10, wherein the cardinality of the data values stored in the cache includes a number of unique data values.

15. The computing device of claim 10, wherein the data values include web site attributes.

16. The computing device of claim 10, further comprising access of the cache by a web server.

17. The computing device of claim 16, wherein the compressed cache is transparent to an application of the web server, and wherein the application of the web server is configured to access a content of the compressed cache.

18. The computing device of claim 10, wherein the instructions further configure the computing device to synchronize content of the compressed cache with a remote cache, the remote cache being part of a network partition of a cache server cluster.

19. The computing device of claim 18, wherein the remote cache is synchronized with content of an additional compressed cache of another web server.

20. A non-transitory computer-readable storage medium including instructions that when executed by a computer, cause the computer to:
    determine a cardinality of data values stored in a cache;
    determine, via an analysis of the cardinality of the data values stored in the cache, a compression ratio for compression of the data values stored in the cache, the compression including a roaring bitmap including one or more of the data values of the cache to be compressed via the compression; and
    apply, based on the analysis, the compression to the data values stored in the cache to generate a compressed cache, the compression including the compression ratio.

* * * * *